United States Patent [19]
Streib et al.

[11] Patent Number: 6,031,383
[45] Date of Patent: Feb. 29, 2000

[54] PROBE STATION FOR LOW CURRENT, LOW VOLTAGE PARAMETRIC MEASUREMENTS USING MULTIPLE PROBES

[75] Inventors: George H. Streib, Washington; Randy J. Schwindt, New Milford, both of Conn.

[73] Assignee: Wentworth Laboratories, Inc., Brookfield, Conn.

[21] Appl. No.: 09/105,599

[22] Filed: Jun. 26, 1998

Related U.S. Application Data

[60] Provisional application No. 60/052,629, Jul. 15, 1997.

[51] Int. Cl.⁷ .................................................. G01R 31/02
[52] U.S. Cl. ........................................ 324/754; 324/761
[58] Field of Search ................................ 324/754, 761, 324/762, 158.1, 725, 757, 758, 73.1; 439/482

[56] References Cited

U.S. PATENT DOCUMENTS 5,345,170  9/1994  Schwindt et al. ........................ 324/754
5,457,398  10/1995  Schwindt et al. ........................ 324/754

OTHER PUBLICATIONS

"Fixturing for Low–Current/Low–Voltage Parametric Testing" by William Knauer, Keithley Instruments, Inc., Systems Division published in Evaluation Engineering—Nov. 1990.

*Primary Examiner*—Vinh P. Nguyen
*Attorney, Agent, or Firm*—William C. Crutcher

[57] ABSTRACT

A probe station has probe manipulators with probe supports disposed around a cover assembly with an inspection opening. Each probe support has a vertical tube extending through an opening in the cover assembly and a horizontal adjustable member extending radially inwardly and supporting a probe holder. Each such horizontal member may be angularly and longitudinally adjusted with respect to its vertical tube. Pairs of coaxial guarding cables run inside the vertical tubes and make Kelvin connections to the probe holders.

6 Claims, 9 Drawing Sheets

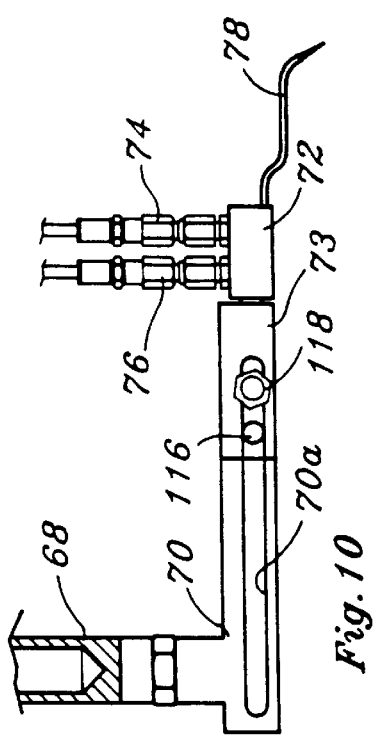
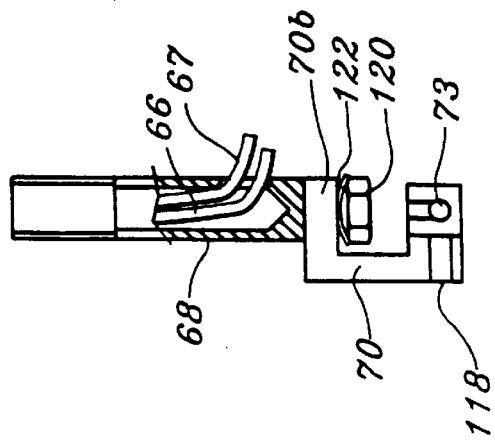
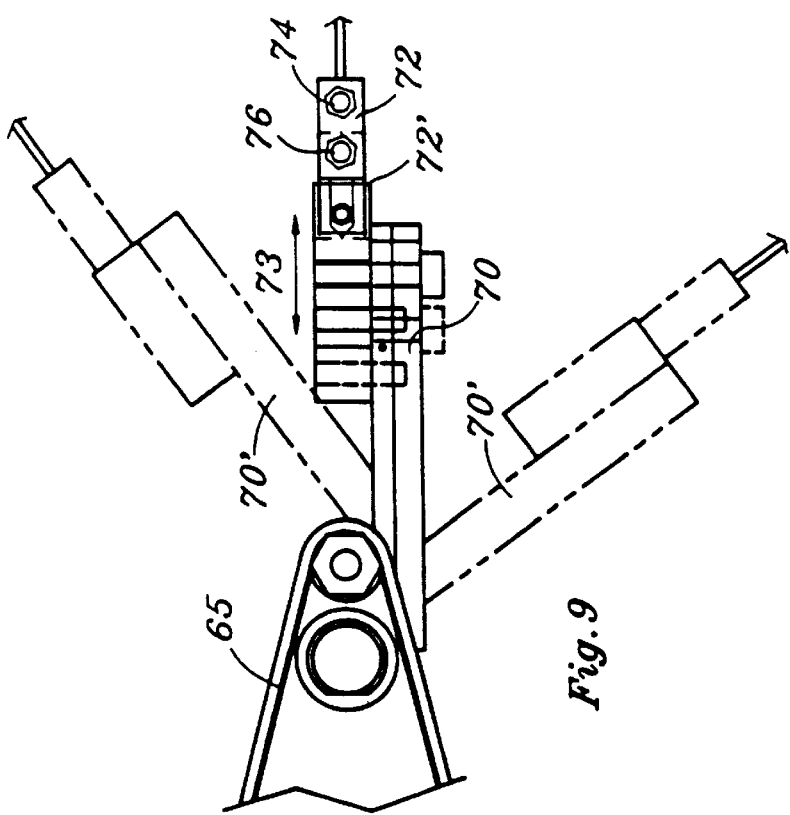

PROBE STATION FOR LOW CURRENT, LOW VOLTAGE PARAMETRIC MEASUREMENTS USING MULTIPLE PROBES

CROSS REFERENCE TO RELATED APPLICATIONS

This application claims the benefit of prior filed co-pending provisional application Ser. No. 60/052,629 filed Jul. 15, 1997.

BACKGROUND OF THE INVENTION

This invention relates generally to probe stations adapted for low current, low voltage parametric testing and measurement of discrete devices on silicon wafers.

More particularly, the invention relates to a probe station having improved geometry for multiple probe manipulators with Kelvin connections to the probe holders, and simplified connection systems for the triaxial cables guarding the probe holders and chucks supporting the silicon wafer.

The special requirements for parametric testing of semiconductor wafers at low currents and low voltages are well known and discussed in many publications such as HP4284A Precision LCR Meter Operation Manual by Hewlett-Packard (December 1991); "Fixturing for Low-Current, Low-Voltage Parametric Testing" published in Evaluation Engineering (November 1990) by William Knauer; Japanese Laid-Open Patent Application No. H 2-220453 entitled "Equipment for On-Wafer Electronic Circuit Checking" laid-open Sep. 3, 1990 in the name of Y. Yamamoto, U.S. Pat. No. 5,345,170 issued Sep. 6, 1994 to Schwindt et al., and U.S. Pat. No. 5,457,398 issued Oct. 10, 1995 to Schwindt et al., these publications being merely illustrative of the prior art.

One known type of probe station for parametric measurement described in the aforementioned patents employs an octagonal box on top of a sealed enclosure, with supports for the probe holders and separate EMI shield tubes for the cables leading to the probe holders extending radially through sliding sealing members on the sides of the octagonal box. This arrangement requires cable connections to the probe holder to be made inside a rather congested area inside the octagonal box and requires two entry points into the octagonal box for each probe holder.

Accordingly, one object of the present invention is to provide an improved geometry for the probe holders and probe manipulators in a low voltage, low current parametric testing probe station.

Still another object of the invention is to provide improved EMI shielding and guarding of the device under test and associated cable and fixture elements.

Still another object of the invention is to provide an improved Kelvin connection system to the probe manipulators and guard members for multiple probing of a device under test.

Still another object of the invention is to provide improved probe holders with angular and longitudinal adjustment features.

SUMMARY OF THE INVENTION

Briefly stated, the invention comprises an improved probe support for a probe station for low current, low voltage parametric measurement of a device under test of the type comprising a base having a platform with a central opening, a cover assembly for the central opening having an inspection opening and a plurality of probe openings circumferentially spaced around the inspection opening, a chuck support for a device to be probed, positioning apparatus adapted to move and position the chuck support, and at least one probe manipulator disposed on the platform. The improved probe support is supported by and positionable by the probe manipulator, and comprises a guarded connection box, a first substantially vertical member depending from the connection box and extending through one of the probe openings, a second member supported from the first member and extending toward a location viewable through the inspection opening, a probe holder disposed on the second member, and guarding cable means connected between the connection box and the probe holder. The probe holders are both angularly adjustable and longitudinally adjustable with respect to the probe supports.

DRAWINGS

The invention, together with other objects and advantages thereof, will best be understood by reference to the following description, taken in connection with the accompanying drawings, in which:

FIG. 1 is a front elevation view of a probe station adapted for parametric low voltage, low current measurements, FIG. 2 is a side elevation view of the probe station including the microscope and optics carrier which is not shown in FIG. 1, FIG. 3 is a plan view of an array of probe manipulators arranged on the probe station platform, without the top cover, FIG. 4 is the same plan view, but with the top cover, FIG. 5 is a side elevation partial view, partly in cross section illustrating a guarded probe holder and wafer carrier for a device under test, FIG. 6 is a top plan view of the wafer carrier, FIG. 7 is a front elevation view, partly in cross section, illustrating the EMI shield and the gas containment chamber, FIG. 8 is a top plan view of the EMI shield with chuck support displaced to one side of the probe station, FIG. 9 is an enlarged plan view of the adjustable probe holder seen in FIG. 3, FIG. 10 is an enlarged side elevational view of the adjustable probe holder seen in FIG. 5, and FIG. 11 is an enlarged end elevation view of the adjustable probe holder.

DESCRIPTION OF THE PREFERRED EMBODIMENT

Figure 1:
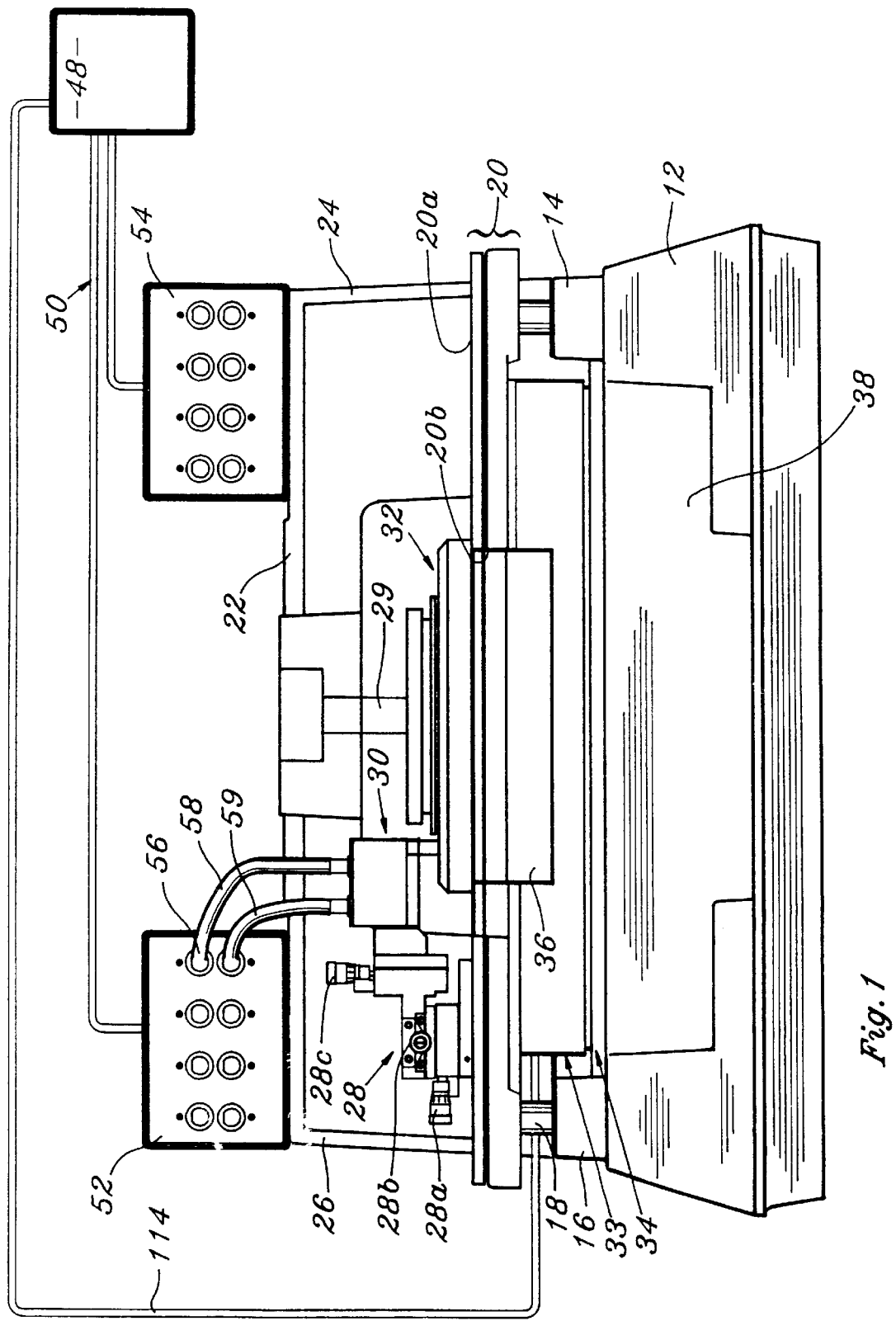
Figure 2:
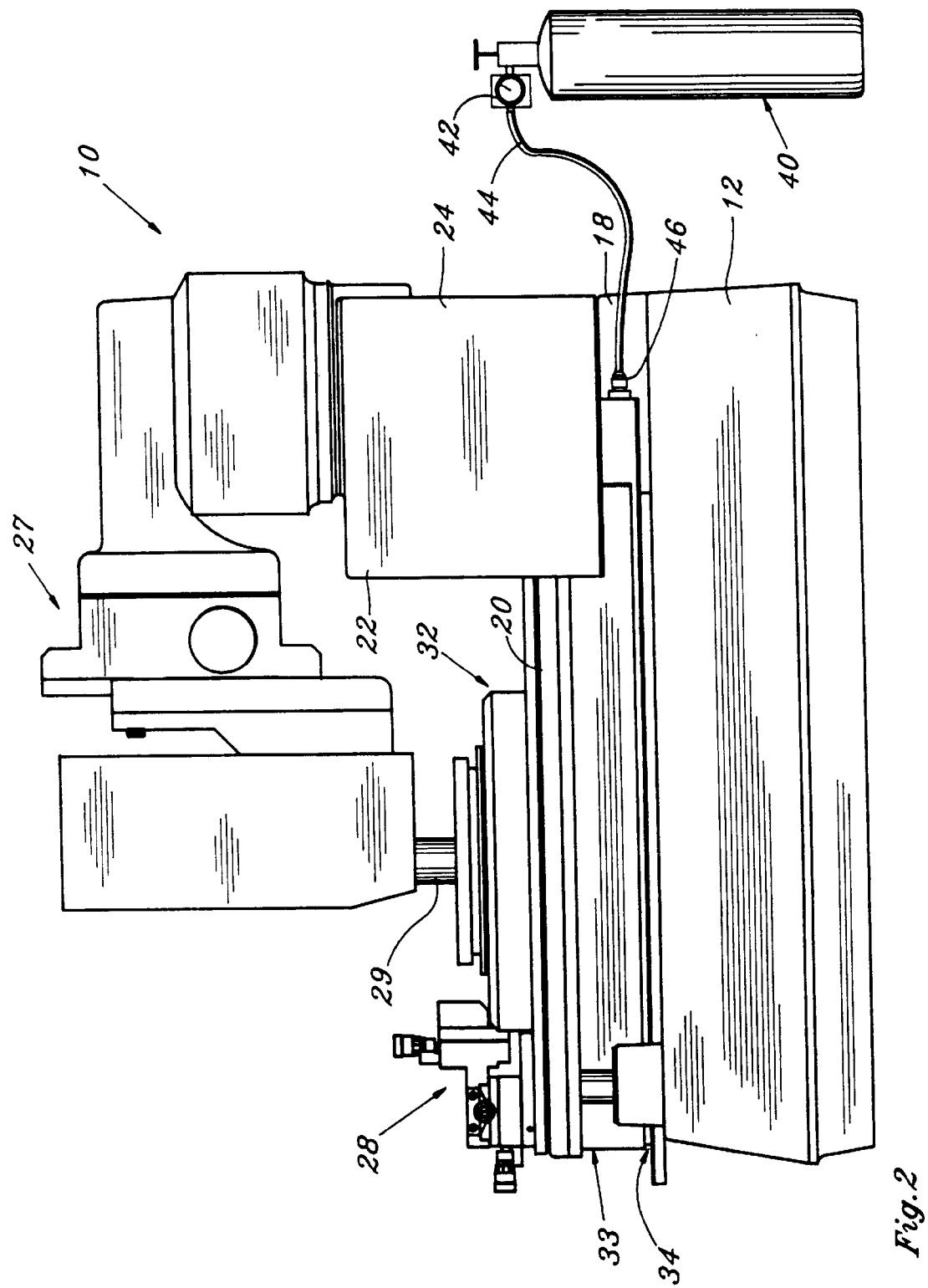

Referring to FIGS. 1 and 2 of the drawing, a probe station is shown generally at 10 to include a base 12. Base 12 includes a pair of front pedestals 14, 16 and a rear pedestal (not shown) having extensions 18 supporting a platform 20, with means to raise and lower the platform. Platform 20 has a top flat reference surface 20a and a central opening 20b. A bridge 22 is supported at the rear of base 12 on legs 24, 26. Bridge 22 serves to carry conventional microscope optics and imaging equipment shown generally at 27 (FIG. 2). The imaging equipment 27 includes one or more viewing microscopes, one of which is seen at 29. A conventional manual probe manipulator or positioner, shown generally as 28, is disposed on surface 20a of the platform with vacuum holding means (not shown) and includes manipulating micrometer knobs 28a, 28b and 28c for adjusting the probe in the x, y and z directions as is well known in the art. The manipulator may also be a remote controlled probe manipulator such as the HOP 2000 manufactured by Wentworth Laboratories. Probe manipulator 28 carries a Faraday cage probe support shown generally at 30 to be discussed later in detail.

A cover assembly 32 covers the platform central opening 20b. The space between the platform and the top of base 12 is enclosed by two overlapping peripheral walls, one peripheral wall is part of a platform frame member 33 attached to the underside of platform 20 and the other peripheral wall is part of a base frame member 34 supported on base 12. Portions of the platform frame members and platform 20 are cut out and the space is closed off with a hinged access door 36. The spaces between pedestals 12, 16 are closed off with a front cover shield 38, and similar space at the rear is closed off by a similar rear cover skirt (not shown). Frame members 33, 34, door 36, front and rear cover shields, base 12 and platform 20 together define a gas containment chamber for receiving an environmentally conditioned gas. Such environmentally conditioned gas is preferably a moisture-free gas, such as dry air or nitrogen. A source of environmentally conditioned gas is depicted schematically in FIG. 2 as a pressurized nitrogen tank 40, with regulator 42, and hose connection 44 connected to the interior of the gas containment chamber via a fitting 46. The gas flows out of the gas containment chamber through unsealed openings and crevices in the lower part of the probe station and between the overlapping peripheral walls of frame members 33, 34. A slight positive pressure above atmospheric at the inlet 46 causes the gas to flow and purge the chamber continuously with dry gas.

Parametric measurements are carried out by suitable test equipment 48 adapted for low voltage, low current measurements. A suitable type of test equipment for carrying out the present invention would be Model no. 4284A manufactured by Hewlett-Packard. Test equipment 48 is connected by appropriate dual cabling 50 for carrying out Kelvin-type connections to a pair of multiple probe terminal boxes 52, 54 mounted on opposite sides of bridge 22. The multiple probe terminal boxes contain an array of triaxial cable terminals 56 for making detachable connections to the probe supports 30. A series of flexible triaxial cables such as the cables shown at 58 and 59 serve to connect appropriate terminals, such as terminal 56, to one of the Faraday cage probe supports 30 in pairs, as depicted in the single unit shown. The two multiple probe boxes 52, 54 will support up to eight such probe manipulators with Faraday cage probe supports disposed in a circumferential array on platform 20 around the cover assembly 32.

MULTIPLE PROBE SUPPORTS

Figure 3:
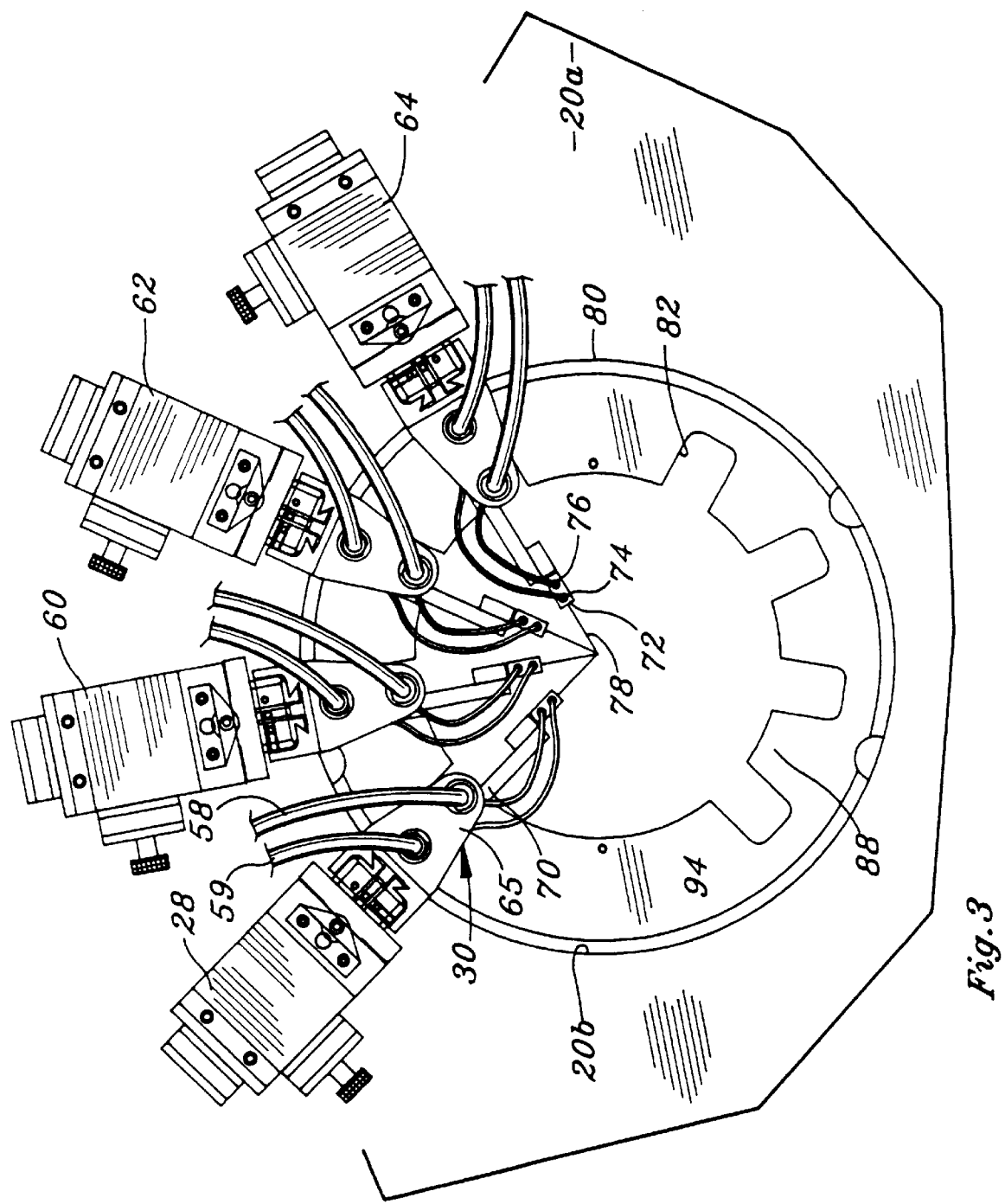
Figure 4:
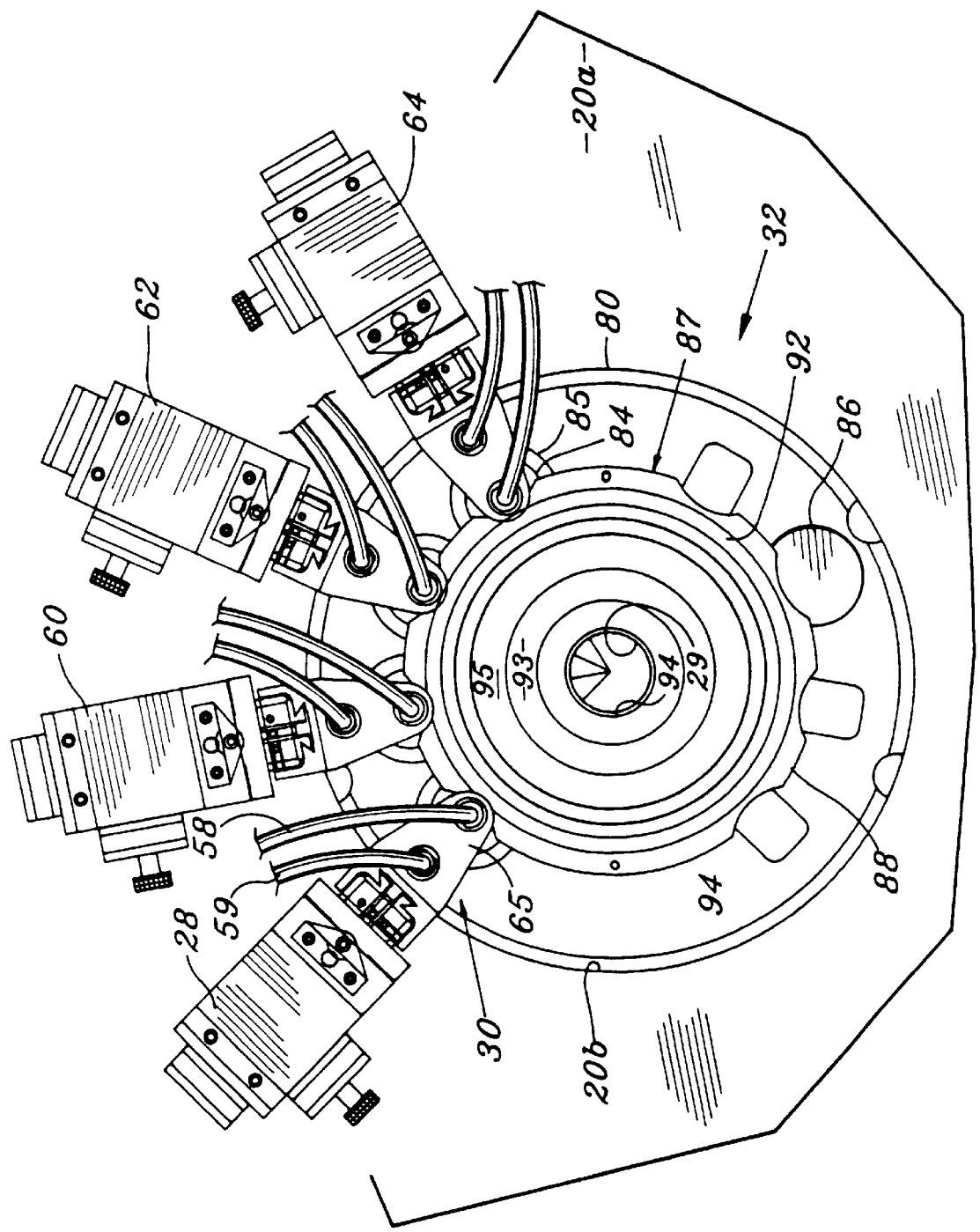

Referring to FIGS. 3 and 4 of the drawing, an array of four probe manipulators 28, 60, 62, 64 are shown circumferentially spaced about the central opening 20b of platform 20. FIG. 3 shows probe holders exposed and FIG. 4 shows the complete cover assembly 32 added. Each of the probe manipulators 28 and Faraday cage probe supports 30 are identical and can be described by reference to the single unit shown in the detailed partial view of FIG. 5, which also shows further details of the cover assembly 32.

Figure 5:
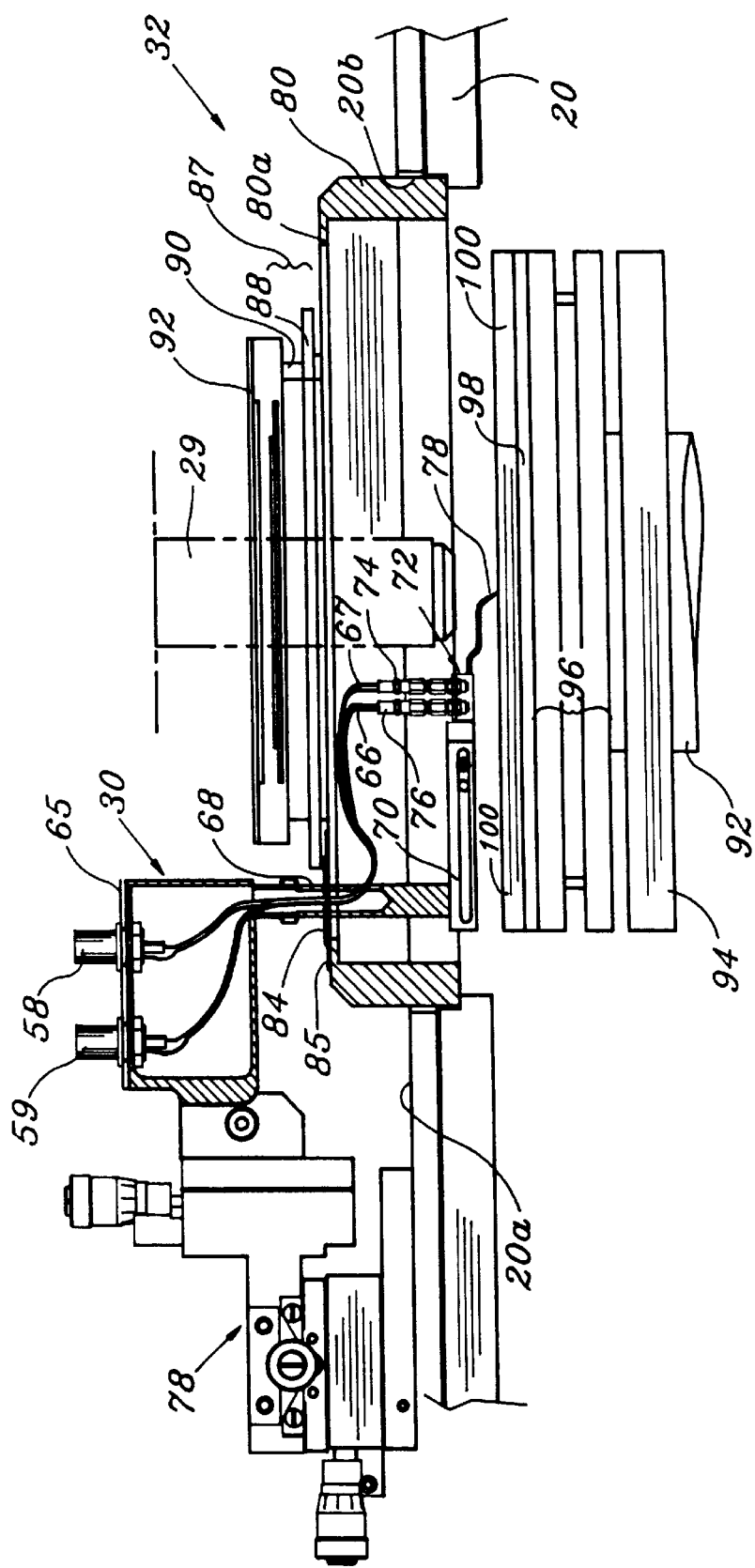

Referring to the view in FIG. 5, each of the Faraday cage supports 30 includes a hollow guarded connection box 65 for making internal electrical connections from a pair of triaxial cables 58 and 59 to a pair of coaxial cables 66, 67. A depending vertical tube 68 supports an angularly adjustable horizontal extension 70 which, in turn, supports a longitudinally adjustable probe holder 72. Details of the adjustable probe holder features will be covered later in a description of FIGS. 9, 10 and 11. Probe holder 72 includes coaxial connectors 74, 76 for making Kelvin connections closely adjacent probe 78. It is important to note that the vertical tube 68 requires the only one entry point through cover assembly 32 and serves to both support the probe holder 72 from extension 70, as well as to provide EMI shielding of coaxial cables entering the enclosure through an opening 68a in tube 68.

Referring to FIG. 3 and FIG. 4, the details of the cover assembly 32 will be described. Cover assembly 32 includes a lower cover ring 80 which is normally not removed. Ring 80 has an upper circumferential surface 80a defining a number of open-ended probe entry ports 82. As seen in FIG. 3 the probe holders 72 are fully accessible for making electrical connections and changing of probe holders. The probe manipulators may be removed by virtue of the open ended ports 82.

FIG. 4 shows the complete cover assembly 32 added over lower cover 80.

Disposed on top of lower cover ring 80 is a removable cover ring assembly 87. Assembly 87 includes an intermediate ring 88 with scalloped side walls which serve to limit the radial movement of the vertical probe support tubes 68. Each of the probe entry ports 82 serves as the entry point for a corresponding vertical tube 68 of a probe support. Each vertical tube 68 is surrounded by sliding washers 84, 85 to provide EMI shielding and light blockage. Probe entry ports 82 which are not occupied by a probe support are covered when not in use by a small plate as shown at 86. The intermediate cover ring 88 includes an upper flange 90 supporting a viewing cover ring 92. Ring 92 defines a central viewing port 94 for the objective microscope 29. Sliding washers 93, 95 provide EMI shielding and light blockage around the microscope tube 29. When cover ring assembly 87 is removed, a probe holder extension arm 70, probe holder 72, and probe 78 for each of the probe holders may be observed in relation to a device under test as indicated in FIG. 3.

CHUCK SUPPORT AND CHUCK ASSEMBLY

Figure 6:
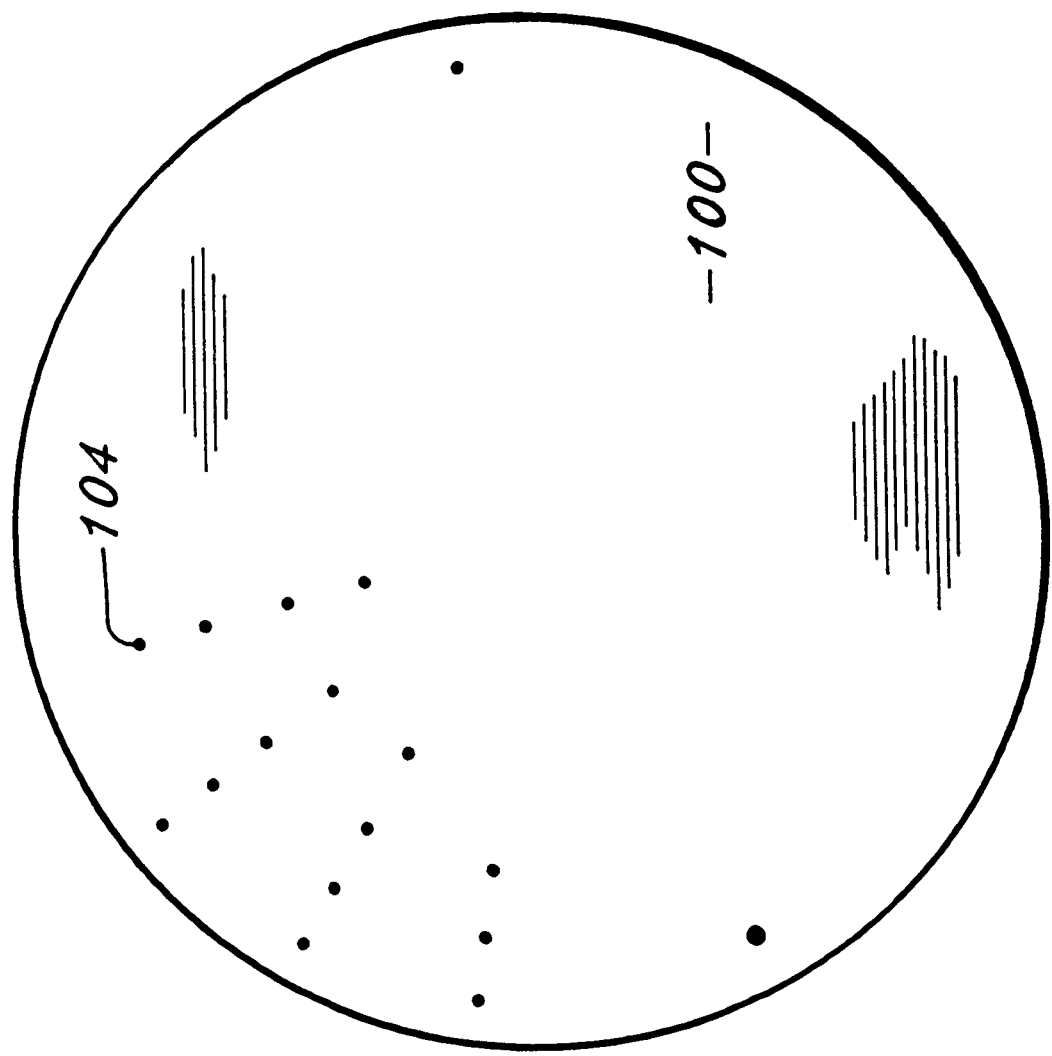
Figure 7:
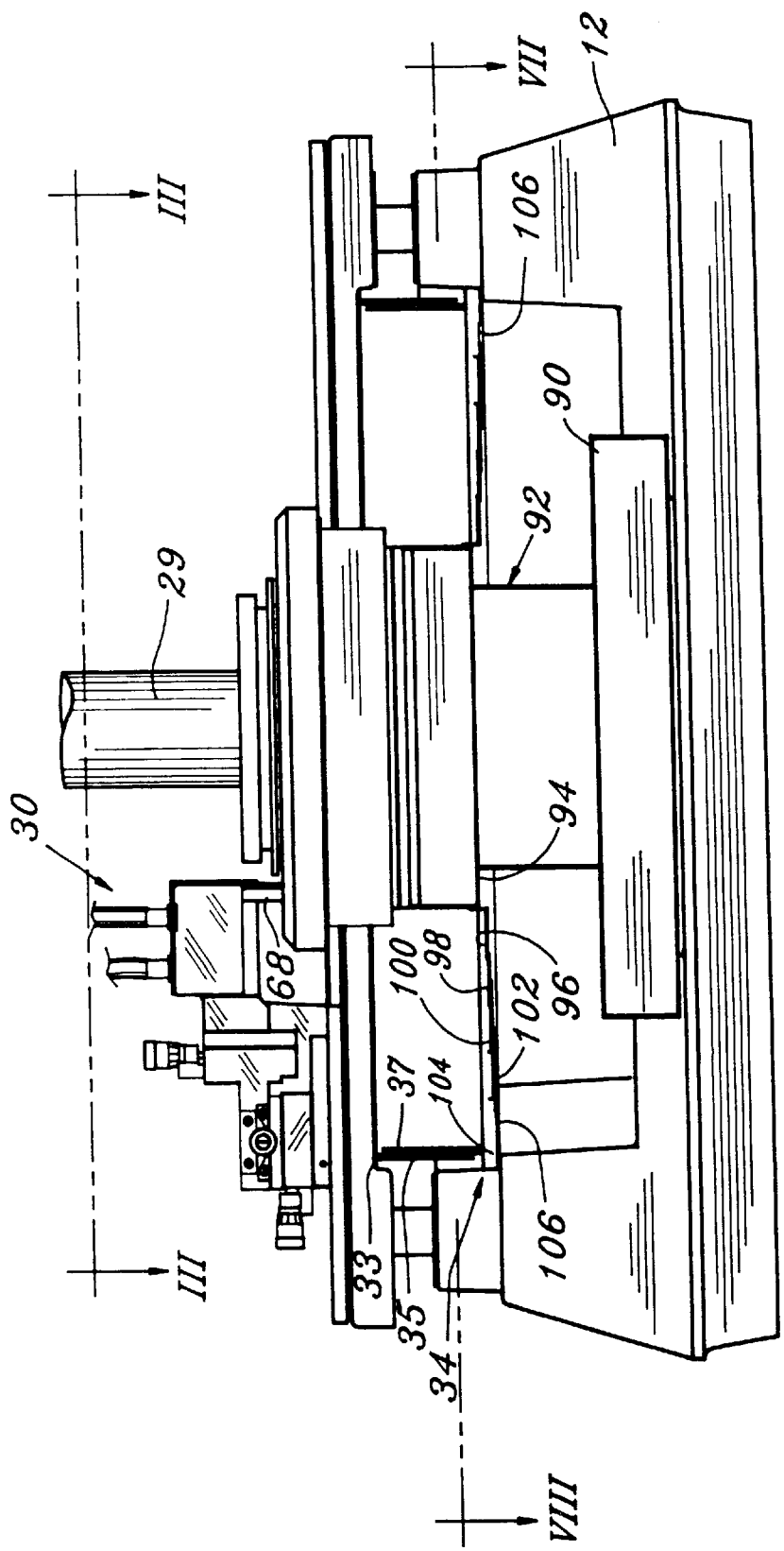
Figure 8:
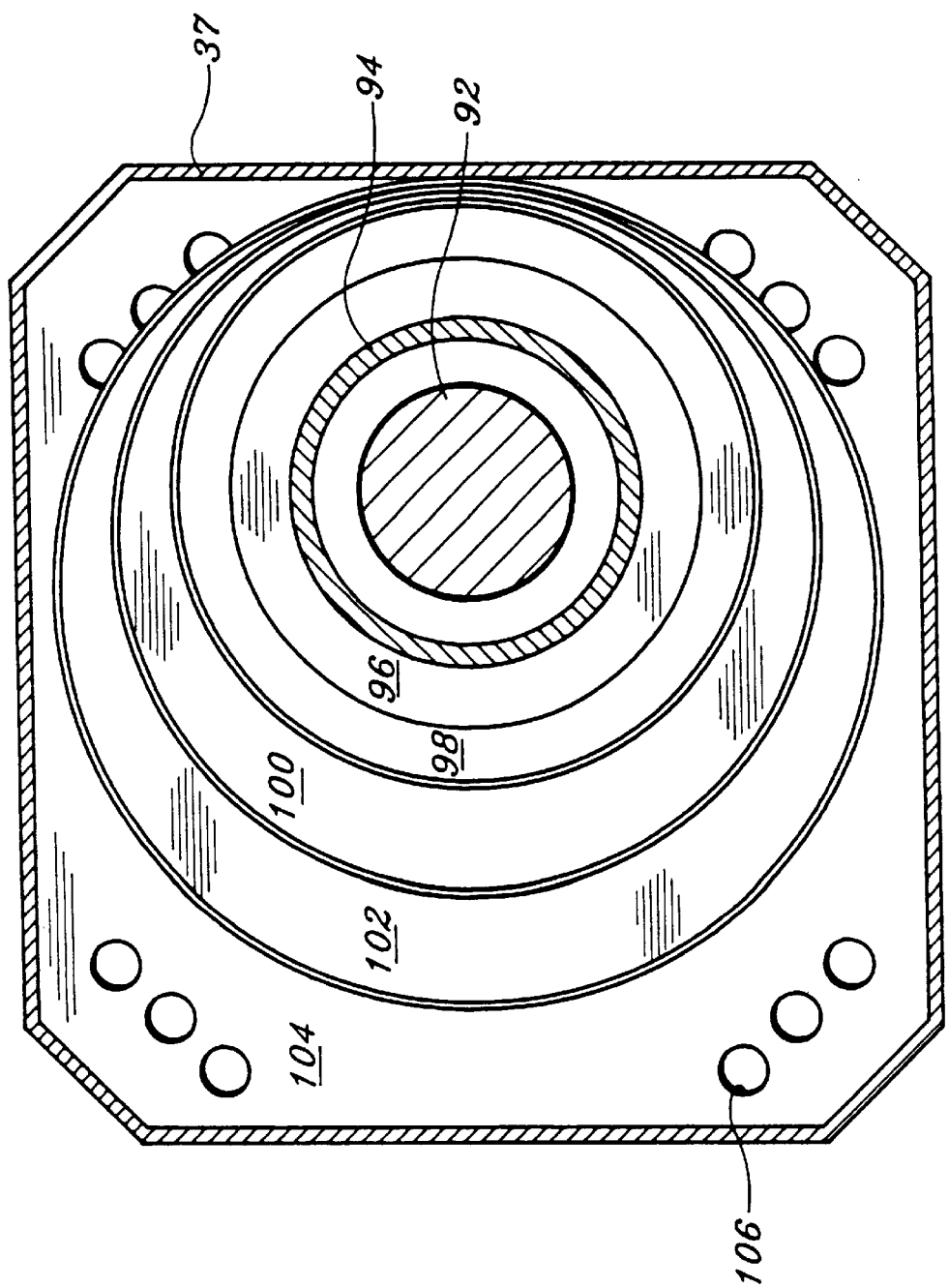

The details of the chuck support and guarded chuck assembly, together with the mechanism to position the chuck inside the gas containment chamber may be seen by reference to FIGS. 5, 6 and 7 of the drawings. Referring first to FIG. 7, a view is shown of the lower portion of the probe station with frame members 33, 34 shown in cross section and front walls removed so as to reveal the chuck positioning mechanism. Platform frame member 33 includes a depending peripheral wall 35 overlapping an upwardly extending peripheral wall 37 which is part of base frame member 34. This allows the platform to be raised and lowered.

A conventional stage 90 contains positioning motors controlled from outside the gas containment chamber to electrically provide positioning in an x-y and z direction of a chuck support shown generally at 92. The construction of stage 90 is well known in the art and contains positioning motors and other electrical components which are a source of EMI radiation at wave lengths which would interfere with parametric measurement of the type desired. Chuck support 92 includes a larger diameter chuck support portion 94 which is arranged to move members of an EMI shield. The shield is an assembly of slidable rings including a ring member 96 which overlaps a ring member 98, which overlaps a ring member 100, which overlaps a ring member 102, which overlaps a stationary flat plate 104 supported by base frame member 34. Ring members include flanges which move an adjacent ring in a manner well known in the art. Rings 96, 98, 100, 102 and sheet 104 are made of metal which will provide EMI shielding of the device under test on the wafer carrier from the EMI radiation sources in stage 90. This arrangement permits movement of probe support 92, 94 with respect to the platform 20, while maintaining EMI shielding.

In order to provide free communication and flow of gas throughout the gas containment chamber, a series of ports 106 are located such that some ports are always totally or partially open, no matter which position the chuck support 92, 94 assumes within the confines of chamber wall 34. The ports 106 are dimensioned so as to have a known relationship to the shortest expected wave length of electromagnetic disturbances from sources of EMI radiation in the positioning stage. Therefore the ports 106 do not impede the efficacy of EMI shielding provided by the rings. The rings 96, 98, 100, 102 may also be perforated or made of mesh, as long as the dimensions of the openings are such as to have a known relationship to the shortest expected wave length of EMI disturbance expected. The flow of moisture-free gas through ports 106 and out of the gas-containment chamber serves to prevent condensation on the electrical and mechanical components below the EMI shield and effectively increases the lives of the components.

CHUCK ASSEMBLY

Referring to FIGS. 5 and 6 of the drawing, the chuck assembly will be described. Disposed on chuck support 92, 94 is a commercially available and well known hot chuck device, such as manufactured by Temptronic Corporation, consisting of elements designated collectively as 96. The Temptronic chuck includes the appropriate electrical connections to raise the temperature of the device under test and hold it at a selectable temperature for testing purposes. These details are not shown, since they are well known in the art. Disposed on top of hot chuck 96 is an isolation disk 98 comprising an insulating material such as ceramic with a metal overlay on either side thereof for shielding the wafer from static electricity from the motors of the drive system and preventing electric current leakage. An isolation disk 98 of this type is known in the art, as more particularly described in Japanese Patent Publication No. S63-138745 filed Dec. 1, 1986 and published Jun. 10, 1988 in the name of Tokyo Electron Company Ltd.

Disposed on top of the isolation disk 98 is a wafer carrier 100. Wafer carrier 100 (FIG. 6) includes conventional vacuum holding ports 104 to firmly hold a silicon wafer on the wafer carrier.

ADJUSTABLE PROBE HOLDER

Reference to the enlarged views of FIGS. 9, 10 and 11 illustrated features of the adjustable probe holders. As shown in FIG. 9, the horizontal extension arm 70 is angularly adjustable with respect to the center line of vertical tube 68, as illustrated by the phantom lines 70'. In addition, the probe holder 72 is adjustable longitudinally along the extension 70, since it is carried in a separate extension adjustment piece 73. The extension adjustment piece 73 and probe holder 72 may be moved horizontally, as indicated by the phantom lines 72', 73'.

Referring to the side elevational view of FIG. 10, extension arm 70 is seen to include a longitudinal slot 70a. A guide pin 116 in the extension adjustment piece 73 projects into the slot. A tightening screw 118 is also threaded into adjustment piece 73. By loosening and then retightening screw 118, the extension adjustment piece 73 and probe holder 72 may be adjusted longitudinally to change the position of probe 78.

Referring to the end view of FIG. 11, which is shown with the probe holder 72 removed, the details of the angular adjustment are shown. An upper flange 70b of the extension arm 70 is pivotably mounted to the end of vertical tube 68 by means of a screw 120. Interposed between flange 70b and the head of screw 120 is a Belville washer. This permits the arm 70 to pivot angularly to either side by approximately 30° in a horizontal plane if sufficient force is applied.

The adjustable features of the probe holder permit probing unusual configurations of the device under test.

OPERATION

Parametric measurement at low voltage and low currents is carried out under control of the external test equipment 48. The array of probe manipulators 34 is positioned with respect to the cover assembly with the cover ring assembly 87 removed, so that the vertical tubes 68 extend through the probe openings, and the probe needles are initially positioned visually. Longitudinal or angular adjustments of the probe holders are made if desired. Thereafter the cover ring assembly 87 may be placed on the lower cover ring 80 and probe manipulation is further conducted utilizing the viewing microscope 29 and conventional manual or computer controlled imaging and positioning systems. The array of parametric probe holders with single vertical entry points through the cover assembly and the adjustable probe holders provide a simplified geometry for multiple probes and excellent shielding of the cables and device under test.

While there has been described herein what is considered to be the preferred embodiment of the invention, other modifications will occur to those skilled in the art and it is desired to cover in the appended claims all such modifications as fall within the scope of the invention.

We claim:

1. A probe station for low current, low voltage parametric measurement of a device under test comprising:

a base having a platform with a central opening, a cover assembly for the central opening, said cover assembly defining an inspection opening and a plurality of probe openings located around the inspection opening, a chuck support for said device under test, positioning apparatus disposed beneath the platform and adapted to move and position the chuck support, at least one probe manipulator disposed above the platform, a probe support attached to and positionable by the probe manipulator, said probe support comprising a guarded connection box, a first substantially vertical member depending from the connection box and extending through one of said probe openings, and a second member supported from the first member and extending toward a location viewable through said inspection opening, a probe holder disposed on the second member, and guarding cable means connected between the connection box and the probe holder.

2. The combination according to claim 1, wherein said first member is hollow and wherein said guarding cable means extends in part within said first member.

3. The combination according to claim 1 and further including a multiple probe terminal box having triaxial fittings, and a plurality of detachable triaxial guarding cables adapted to connect said triaxial fittings in the terminal box to each of said connection boxes in the probe supports.

4. The combination according to claim 3, wherein the guarding cable means comprises a pair of coaxial cables for each probe holder and wherein the triaxial guarding cables are connected in pairs to each said connection box.

5. The combination according to claim 1, wherein the probe holders are both angularly adjustable and longitudinally adjustable with respect to the probe supports.

6. The combination according to claim 5, wherein the first member is pivotably connected to the second member with a Belleville washer to provide the angular adjustment and wherein the probe holder is axially extendable along the second member to provide the longitudinal adjustment.

* * * * *